(12) United States Patent
Dogan et al.

(10) Patent No.: US 11,710,694 B2
(45) Date of Patent: Jul. 25, 2023

(54) INTEGRATED CIRCUIT STRUCTURES WITH CONTOURED INTERCONNECTS

(71) Applicant: Intel Corporation, Santa Clara, CA (US)

(72) Inventors: Ebubekir Dogan, Portland, OR (US); Ramanan Ehamparam, Beaverton, OR (US); Jiho Kang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 912 days.

(21) Appl. No.: 16/421,940

(22) Filed: May 24, 2019

(65) Prior Publication Data
US 2020/0373236 A1     Nov. 26, 2020

(51) Int. Cl.
| H01L 23/52 | (2006.01) |
| H01L 23/31 | (2006.01) |
| H01L 23/48 | (2006.01) |
| H01L 25/18 | (2023.01) |
| H01L 25/16 | (2023.01) |
| H01L 23/522 | (2006.01) |
| H01L 25/065 | (2023.01) |
| H01L 23/00 | (2006.01) |
| H01L 23/528 | (2006.01) |

(52) U.S. Cl.
CPC ...... *H01L 23/5226* (2013.01); *H01L 23/3128* (2013.01); *H01L 23/5283* (2013.01); *H01L 24/09* (2013.01); *H01L 24/17* (2013.01); *H01L 25/0655* (2013.01); *H01L 2224/0401* (2013.01)

(58) Field of Classification Search
CPC ............. H01L 23/5226; H01L 23/3128; H01L 23/5283; H01L 25/0655; H01L 25/16; H01L 25/18; H01L 27/0924; H01L 29/7853; H01L 29/7854; H01L 2224/16145; H01L 2224/16227; H01L 2224/17181; H01L 2924/15311
See application file for complete search history.

(56) References Cited

U.S. PATENT DOCUMENTS

| 10,224,242 | B1 * | 3/2019 | Yang | H01L 23/5283 |
| 10,373,866 | B1 * | 8/2019 | Yang | H01L 28/82 |
| 10,381,263 | B1 * | 8/2019 | Yang | H01L 23/53228 |
| 10,847,454 | B2 * | 11/2020 | Lee | H01L 23/5283 |
| 11,075,279 | B2 * | 7/2021 | Liao | H01L 29/66545 |
| 2016/0293600 | A1 * | 10/2016 | You | H01L 23/485 |
| 2016/0379950 | A1 * | 12/2016 | Tsai | H01L 23/49833 257/737 |
| 2017/0148914 | A1 * | 5/2017 | Lee | H01L 29/0649 |
| 2017/0263557 | A1 * | 9/2017 | Clevenger | H01L 23/53266 |
| 2019/0148325 | A1 * | 5/2019 | Lu | H01L 24/05 257/737 |
| 2019/0237580 | A1 * | 8/2019 | Bi | H01L 27/1211 |

(Continued)

FOREIGN PATENT DOCUMENTS

CN        111987063 A      11/2020

*Primary Examiner* — Ida M Soward
(74) *Attorney, Agent, or Firm* — Akona IP

(57) ABSTRACT

Integrated circuit (IC) structures include transistor devices with interconnect structures, e.g., a source contact, drain contact, and/or gate contact. The interconnect structures have rounded top surfaces. Contouring the top surfaces of transistor contacts may decrease the likelihood of electrical shorting and may permit a larger volume of insulating dielectric between adjacent contacts.

19 Claims, 8 Drawing Sheets

(56) References Cited

U.S. PATENT DOCUMENTS

2019/0341298 A1\* 11/2019 Yang ................. H01L 23/53266
2020/0083287 A1\* 3/2020 Chou ..................... H10N 50/10
2020/0343135 A1\* 10/2020 Huang ............. H01L 21/02063

\* cited by examiner

US 11,710,694 B2

INTEGRATED CIRCUIT STRUCTURES WITH CONTOURED INTERCONNECTS

BACKGROUND

Transistors typically include source/drain (S/D) contacts and second interconnect structures. These interconnect structures may be separately electrically controlled to achieve a desired state of operation in the transistor. More generally, interconnect structures may be used to form electrical pathways in an integrated circuit (IC) device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
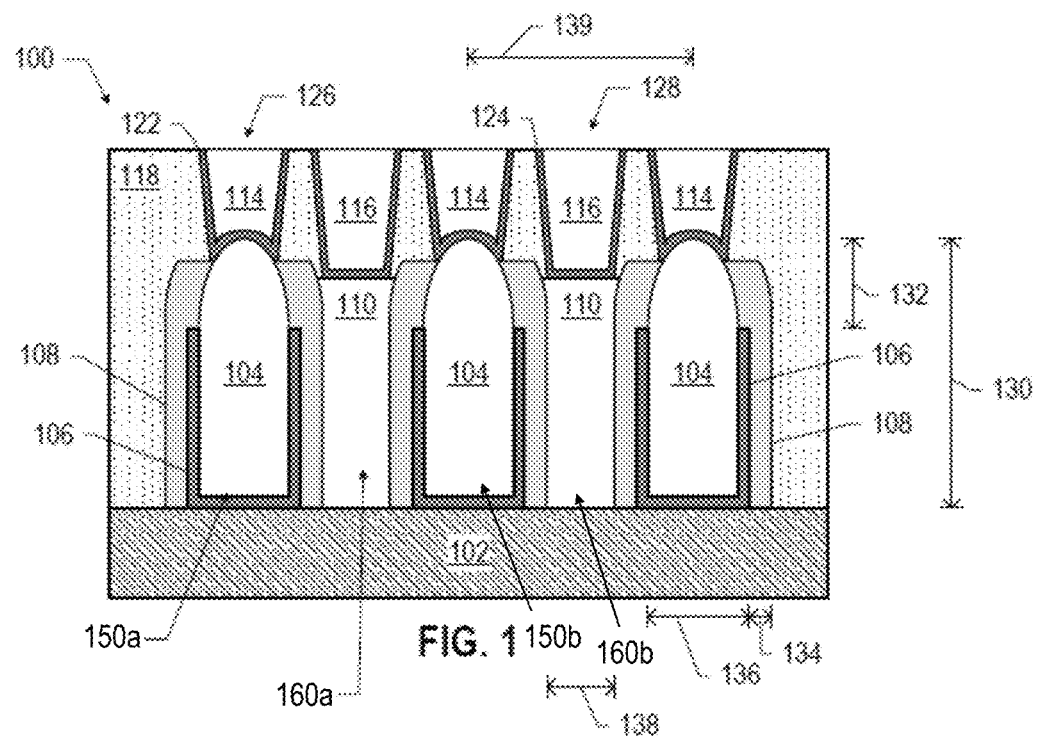
FIG. 1 is a cross-sectional view of an integrated circuit (IC) structure including contoured interconnects, in accordance with various embodiments.

Disclosed herein are integrated circuit (IC) structures with contoured interconnects, as well as related methods and devices. For example, in some embodiments, a device region of an IC die includes interconnects (e.g., source/drain (S/D) contacts) that have rounded top surfaces.

The IC structures disclosed herein may exhibit significantly reduced electrical shorting between adjacent interconnects relative to conventional structures, and/or may decrease the likelihood of electrical opens in the interconnects (due, e.g., to seams or voids in high aspect ratio openings). In some cases, ten times fewer shorts and opens may be observed in the IC structures disclosed herein than in conventional structures. In particular, the rounding of interconnects disclosed herein may permit a larger volume of insulating dielectric between adjacent interconnects and may provide a larger opening through which interconnect metal may be deposited (without increasing the pitch).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 2" may be used to refer to the collection of drawings of FIGS. 2A-2K.

FIG. 1 is a cross-sectional view of an IC structure 100 including contoured interconnects, in accordance with various embodiments. In particular, FIG. 1 illustrates a base structure 102 along which first interconnects 150 and second interconnects 160 are alternatingly arranged. The first interconnects 150 include, e.g., a first interconnect 150a and a second interconnect 150b. The second interconnects 160 include, e.g., a third interconnect 160a and a fourth interconnect 160b. The first interconnects 150 and the second interconnects 160 may make electrical contact with devices or conductive elements (not shown) in the base structure 102. For example, in some embodiments, the base structure 102 may include one or more transistors (which may take the form of any of the transistors 1640 discussed below with reference to FIG. 5), the first interconnects 150 may be in electrical contact with S/D regions (gates) of the transistors, and the second interconnects 160 may be in electrical contact with gates (S/D regions) of the transistors. In some such embodiments, the first interconnects 150 and the second interconnects 160 may be part of the device region (e.g., the device region 1604 discussed below with reference to FIG. 5) of an IC device. In another example, the first interconnects 150 and second interconnects 160 may be part of a metallization stack in an IC device (e.g., the metallization stack 1619 discussed below with reference to FIG. 5). In some such embodiments, the base structure 102 may include a device region 1604 (as discussed below with reference to FIG. 5), and may also include at least a portion of a metallization stack 1619 (as discussed below with reference to FIG. 5). The top surfaces of the first interconnects 150 (the surfaces in contact with the vias 126, distal from the base structure 102) may be rounded, as shown.

The first interconnects 150 may include a first metal 104 and a liner material 106. The height 130 of the first metal 104 may have any suitable value; in some embodiments, the height 130 may be between 20 nanometers and 100 nanometers. In some embodiments, the width 136 of the first metal 104 may be between 20% of the height 130 and 30% of the height 130. The liner material 106 may be present on side faces of the first metal 104, between the first metal 104 and the second metal 110 of the second interconnects 160, and between the first metal 104 and the base structure 102. The liner material 106 may thus have a U-shaped cross-section, as shown. The top surface of the liner material 106 may be spaced away from the rounded top surface of the first interconnects 150 by a distance 132. In some embodiments, the distance 132 may be between 10% of the height 130 and 30% of the height 130. The liner material 106 may be conformal on the side faces of the first metal 104, and may have any suitable thickness (e.g., between 1 nanometer and 5 nanometers). The liner material 106 may act as a diffusion liner to limit diffusion of the first metal 104 into the surrounding material and/or as an adhesion liner to improve mechanical coupling between the first metal 104 and the surrounding material. In some embodiments, the liner material 106 may include titanium and nitrogen (e.g., in the form of titanium nitride), titanium, tantalum, or tantalum and nitrogen (e.g., in the form of tantalum nitride). In some embodiments, the first metal 104 may include cobalt, tungsten, copper, or another suitable metal.

A spacer material 108 may be conformal over portions of the first interconnects 150, and may provide electrical isolation between the first metal 104 and surrounding material (e.g., the second metal 110). The spacer material 108 may be proximate to side faces of the first metal 104 such that the liner material 106 (where present) is between the first metal 104 and the spacer material 108. The spacer material 108 may extend onto the rounded top surface of the first metal 104, but in some areas, may not extend fully over the top surface of the first metal 104 to accommodate contact with a via 126, as shown. The spacer material 108 may include any suitable dielectric material, such as carbon-doped oxide, silicon nitride, silicon oxide, or other carbides or nitrides (e.g., silicon carbide, silicon nitride doped with carbon, or silicon oxynitride). For example, in some embodiments, the spacer material 108 may include silicon, oxygen, carbon, and nitrogen. The thickness 134 of the spacer material 108 may be between 10% of the height 130 and 30% of the height 130. Although various ones of the accompanying figures depict the top surface of the spacer material 108 as being substantially "squared off," this is simply for ease of illustration, and in practical devices, the top surface of the spacer material 108 may taper, narrowing as the spacer material 108 approaches a top surface of the first metal 104.

The second interconnects 160 may extend between the spacer material 108 on proximate sides of the neighboring first interconnects 150, as shown. The second interconnects 160 may include a second metal 110. The second metal 110 may include any of the metals discussed above with reference to the first metal 104. In some embodiments, the second interconnects 160 may include a liner material (not shown), conformal on the side faces of the second metal 110 (e.g., having a U-shaped cross-section along the base structure 102 and the spacer material 108); this liner material may take any of the forms of the liner material 106 discussed above.

Vias 126 may make electrical contact with the first interconnects 150. The vias 126 may include a liner material 122 (which may include an adhesion liner and/or a diffusion barrier) and a metal fill 114. In embodiments in which the first interconnects 150 make contact with transistors in a device region, the vias 126 may be part of a first interconnect layer 1606 above the device region 1604, as discussed below with reference to FIG. 5. Similarly, vias 128 may make electrical contact with the second interconnects 160. The vias 128 may include a liner material 124 (which may include an adhesion liner and/or a diffusion barrier, and which may be the same as the liner material 122) and a metal fill 116 (which may be the same as the metal fill 114). In embodiments in which the second interconnects 160 make contact with transistors in a device region, the vias 128 may be part of the first interconnect layer 1606 above the device region 1604, as discussed below with reference to FIG. 5. A dielectric material 118 may be disposed around the vias 126/128 and the interconnects 150/160; the dielectric material 118 may include any suitable dielectric material, such as silicon nitride, silicon oxide, or any suitable interlayer dielectric As noted above, the top surfaces of the first interconnects 150 may be rounded. Consequently, the distance 139 between adjacent first interconnects 150 proximate to the top surfaces may be greater than the distance 138 between adjacent first interconnects 150 proximate to the base structure-facing surfaces of the first interconnects 150, as shown. In embodiments in which the IC structure 100 is manufactured by first forming the first interconnects 150 and spacer material 108, then filling in the second metal 110 of the second interconnects 160, having a greater distance 139 than the distance 138 may provide a wider opening for the deposition of the second metal 110 without increasing the spacing of the first interconnects 150 at the base structure 102. Having such a wider opening may permit a more accurate and reliable deposition of the second metal 110, reducing the likelihood that voids or seams will form in the second metal 110 (as might happen if the opening were narrower or necked). Further, the rounded top surfaces of the first interconnects 150 may increase the spacing between the first metal 104 and the second metal 110 proximate to the top surface of the first metal 104, relative to structures in which the top surface of the first interconnect 150 is squared-off instead of rounded. Increasing the spacing between the first metal 104 and the proximate second metal 110 may reduce the likelihood of an undesirable short between the two, further increasing the reliability of the IC structure 100 relative to conventional structures.

The IC structures 100 disclosed herein may be manufactured using any suitable techniques. For example, FIGS. 2A-2K illustrate stages in an example process of manufacturing an IC structure 100 with contoured interconnects, in accordance with various embodiments. Although various operations are illustrated once each and in a particular order in FIGS. 2A-2K, operations may be reordered and/or repeated as desired.

Figure 2A:
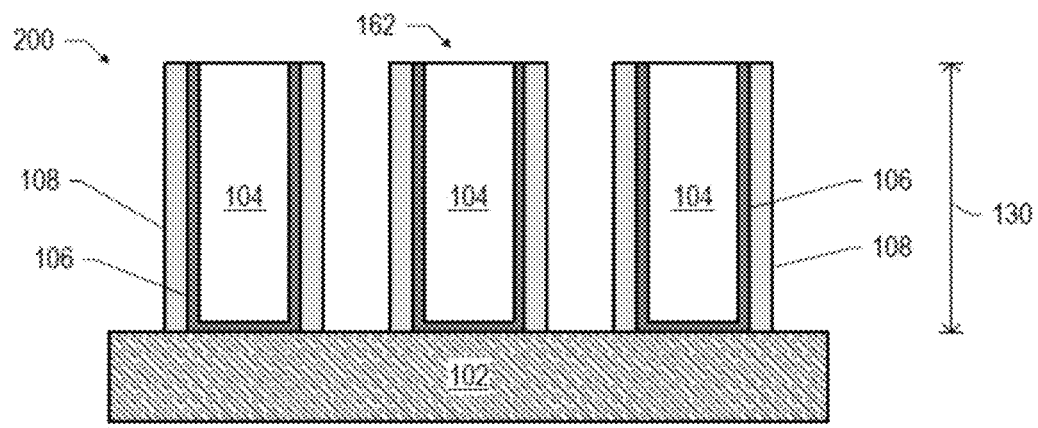
FIGS. 2A-2K illustrate stages in an example process of manufacturing an IC structure with contoured interconnects, in accordance with various embodiments.

FIG. 2A illustrates an assembly 200 including initial first interconnects 162 spaced apart along the base structure 102. The initial first interconnects 162 include first metal 104 with squared-off top surfaces and liner material 106 extending up to the top surface of the first metal 104. Spacer material 108 is disposed on lateral faces of the initial first interconnects 162, extending up to the top surface of the first metal 104. The assembly 200 may be fabricated using any suitable technique, such as depositing the patterned first metal 104 on the base structure 102, depositing the liner material 106 on side faces of the patterned first metal 104, and then forming the spacer material 108 (e.g., by conformal deposition followed by a directional etch, as known in the art). The height of the first metal 104 in the initial first interconnects 162 may be substantially equal to the height 130 of the first metal 104 in the first interconnects 150, as discussed further below.

Figure 2B:
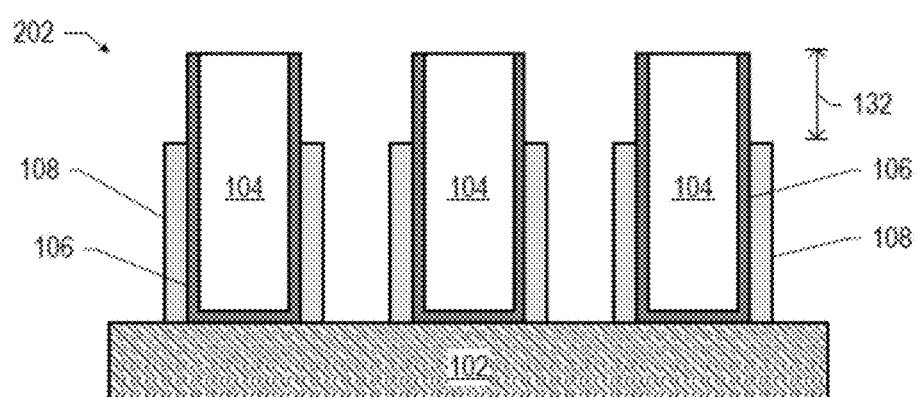

FIG. 2B illustrates an assembly 202 subsequent to recessing the spacer material 108 of the assembly 200 (FIG. 2A), exposing a top portion of the liner material 106. The spacer material 108 may be recessed to a desired depth that is substantially equal to the distance 132 discussed above with reference to FIG. 1. The spacer material 108 may be recessed using any suitable etch process (e.g., dry etch).

Figure 2C:
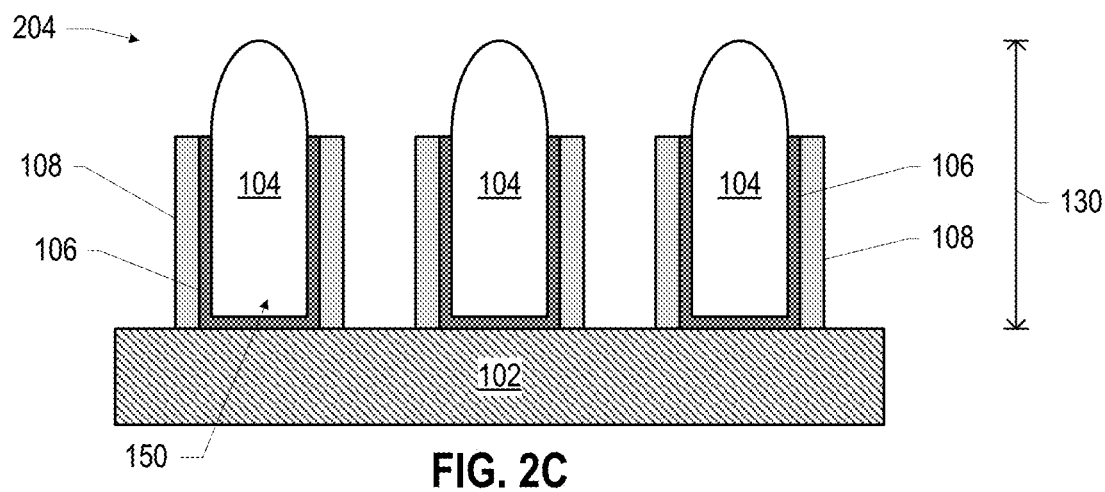

FIG. 2C illustrates an assembly 204 subsequent to etching the liner material 106 and the first metal 104 of the assembly 202 (FIG. 2B). In some embodiments, an etch method may be used that has a higher etch rate for the liner material 106 than for the first metal 104 so that the exposed liner material 106 is substantially removed while the exposed top corners of the first metal 104 are removed, resulting in a rounded top surface of the first metal 104 and the first interconnects 150. This rounding may be caused by a difference in chemical composition of the material at the top surface of the first metal 104 versus the material at the side surfaces of the first metal 104 (which may be an interfacial material formed at the interface between the first metal 104 and the liner material 106), which may result in greater etching of the first metal 104 from the side surfaces as the liner material 106 is removed. In some embodiments, the etch method may include a wet chemical treatment that etches the liner material 106 and the first metal 104 at different rates (e.g., one that etches the liner material 106 at a rate between 5 Angstroms per minute and 10 Angstroms per minute, and that etches the first metal 104 at a rate between 2 Angstroms per minute and 5 Angstroms per minute). The etch method may be selected so that the total height 130 of the first metal 104 is not significantly reduced relative to the height of the first metal 104 in the initial first interconnect 162 (FIG. 2A).

Figure 2D:
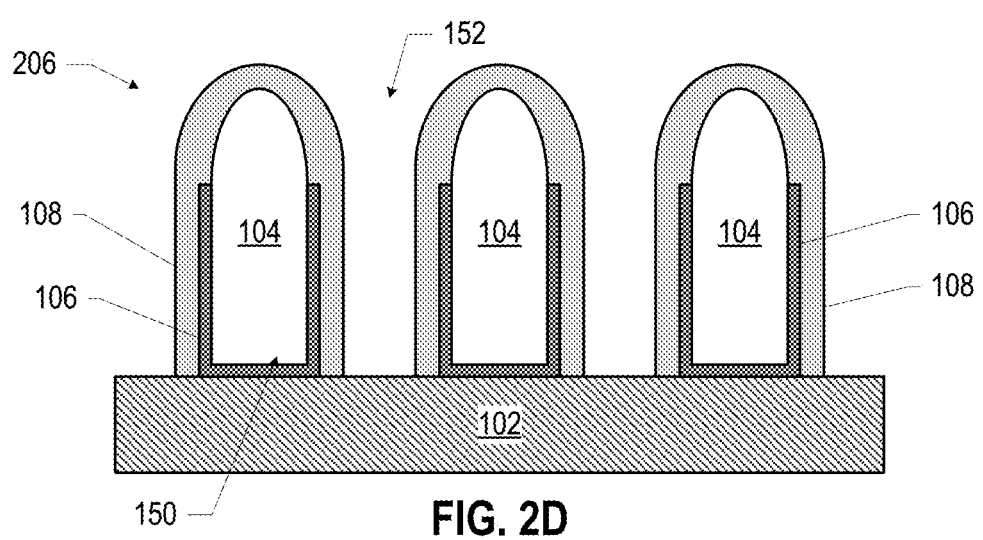

FIG. 2D illustrates an assembly 206 subsequent to depositing additional spacer material 108 over the exposed rounded top surface of the first metal 104 of the assembly 204 (FIG. 2C). The additional spacer material 108 may be deposited conformally over the first interconnects 150, as shown. The base structure 102 between the first interconnects 152/spacer material 108 may be exposed via openings 152, as shown. As discussed above, the openings 152 are wider proximate to the top surfaces of the first interconnects 150 than proximate to the base structure 102.

Figure 2E:
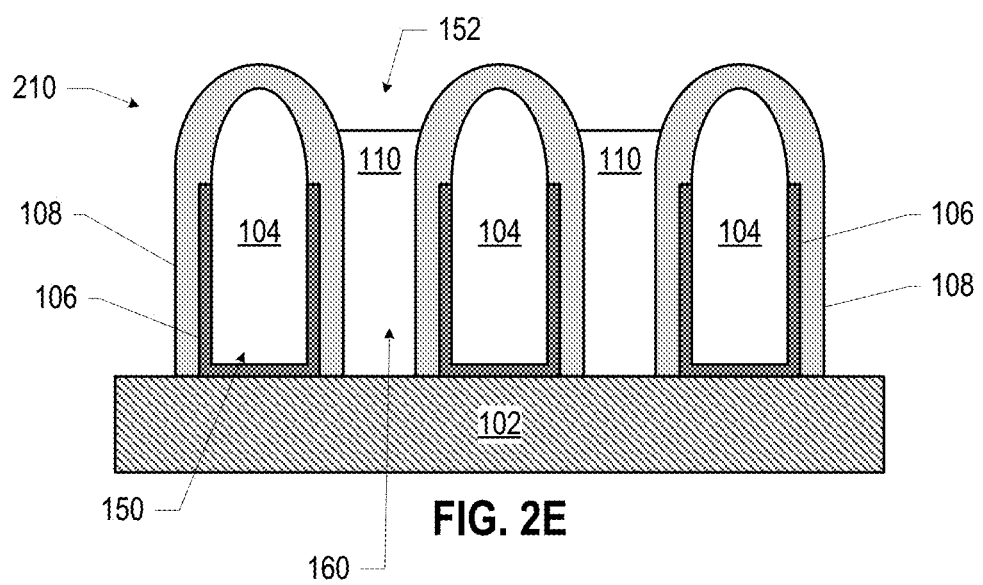

FIG. 2E illustrates an assembly 210 subsequent to depositing a second metal 110 in the openings 152 of the assembly 206 (FIG. 2D), forming the second interconnects 160. As noted above, the "wide" openings 152 may facilitate the deposition of the second metal 110 such that the second metal 110 of the assembly 210 may exhibit fewer voids and seams than if the openings 152 were narrower (e.g., if the top surfaces of the first interconnects 150 were not rounded). Although FIG. 2E (and others of the accompanying figures) depict the second metal 110 as being filled to a height below the height of the first metal 104, this is simply for illustration, and the second metal 110 may be deposited to a height equal to or greater than the height of the first metal 104, as desired. In embodiments in which the second interconnects 160 include a liner material, as discussed above, a conformal layer of the liner material may be deposited before deposition of the second metal 110.

Figure 2F:
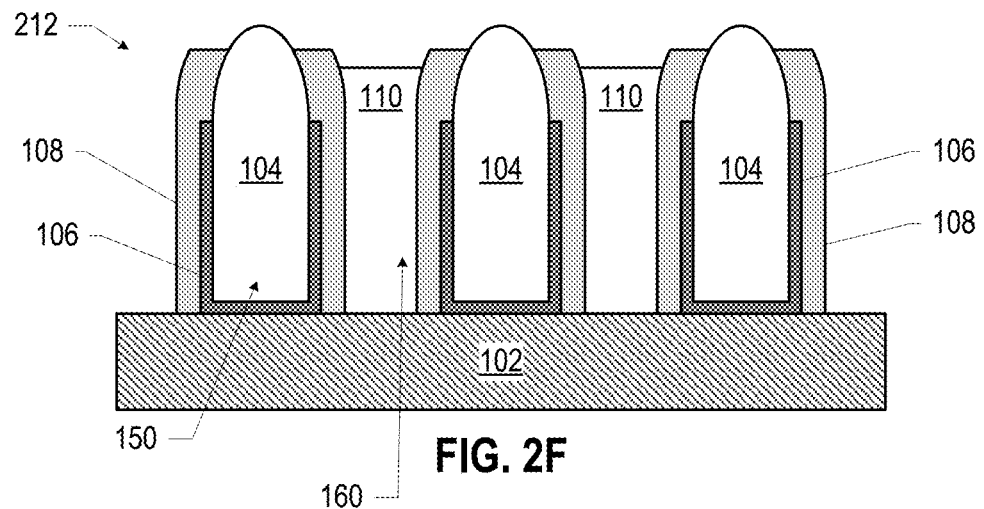

FIG. 2F illustrates an assembly 212 subsequent to recessing the spacer material 108 of the assembly 210 (FIG. 2E) to expose at least some of top surface of the first metal 104. The spacer material 108 may be recessed to a desired depth using a timed etch, for example.

Figure 2G:
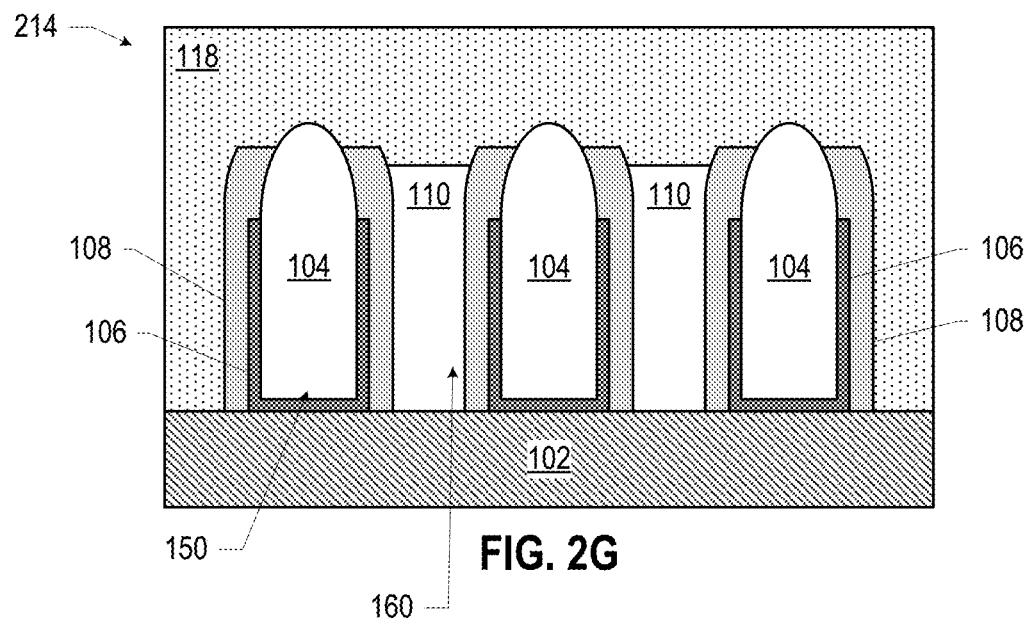

FIG. 2G illustrates an assembly 214 subsequent to depositing a dielectric material 118 over the assembly 212 (FIG. 2F). The dielectric material 118 may be deposited using any suitable technique (e.g., spin-on deposition).

Figure 2H:
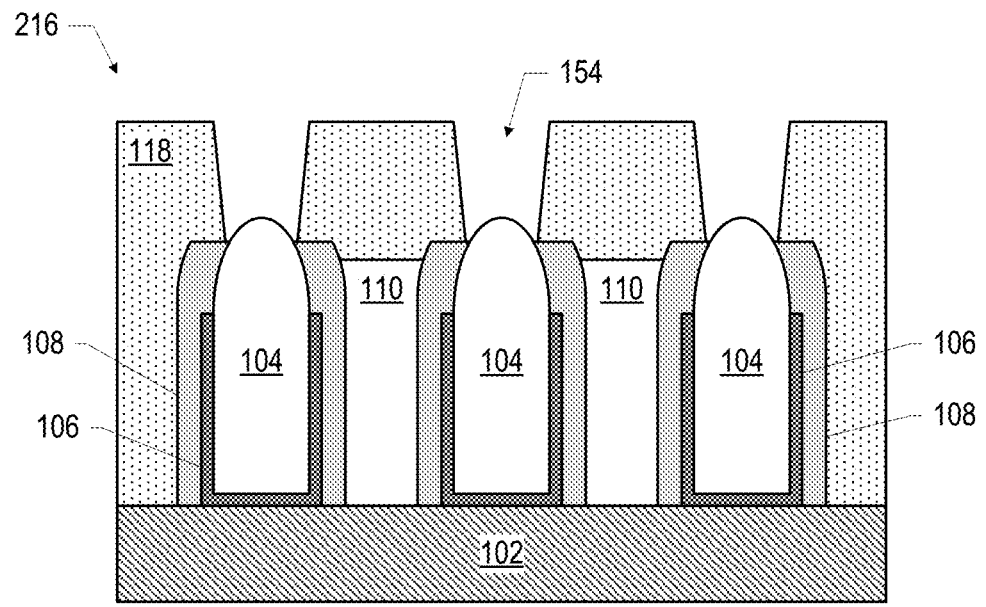

FIG. 2H illustrates an assembly 216 subsequent to forming cavities 154 in the assembly 214 (FIG. 2G). The cavities 154 may extend through the dielectric material 118 and may expose the first metal 104. In some embodiments, the cavities 154 may be tapered, narrowing towards the first metal 104, as shown.

Figure 2I:
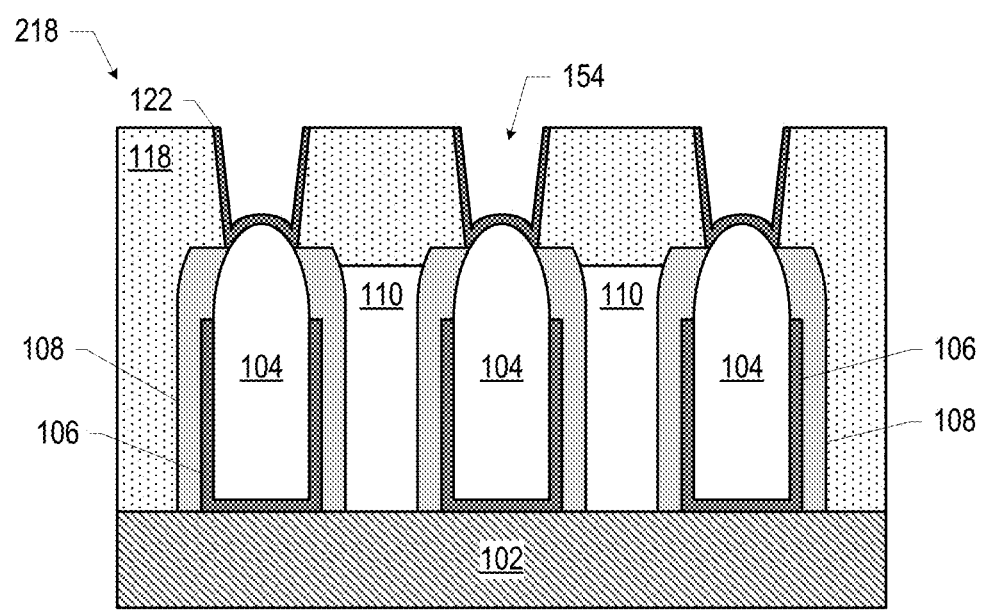

FIG. 2I illustrates an assembly 218 subsequent to depositing a conformal liner material 122 in the cavities 154 of the assembly 216 (FIG. 2H). The liner material 122 may contact the first metal 104 at the bottom of the cavities 154, as shown.

Figure 2J:
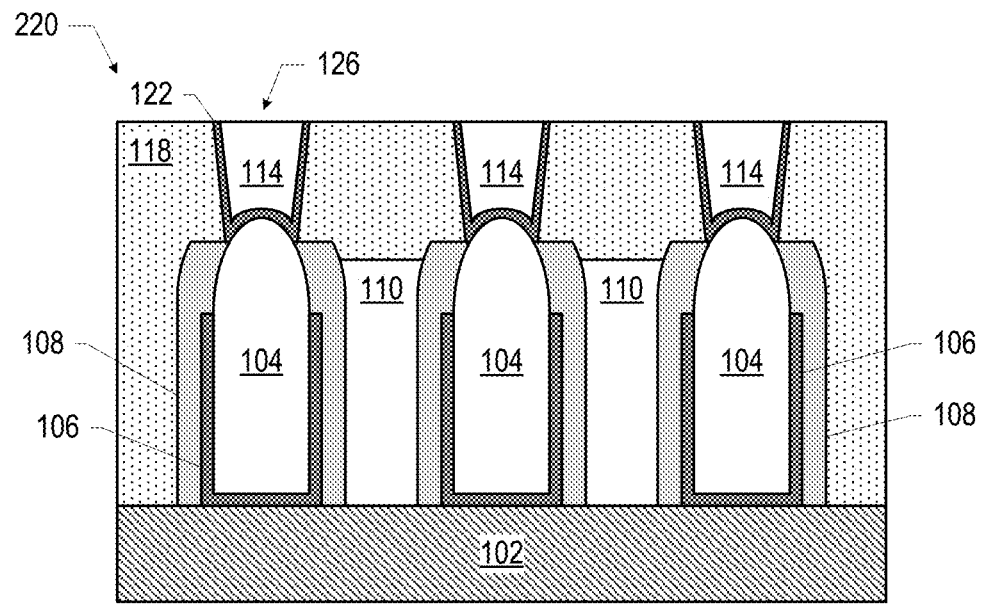

FIG. 2J illustrates an assembly 220 subsequent to depositing a metal fill 114 in the cavities 154 of the assembly 218 (FIG. 2I). The metal fill 114 may fill the remainder of the cavities 154, and may complete the vias 126.

Figure 2K:
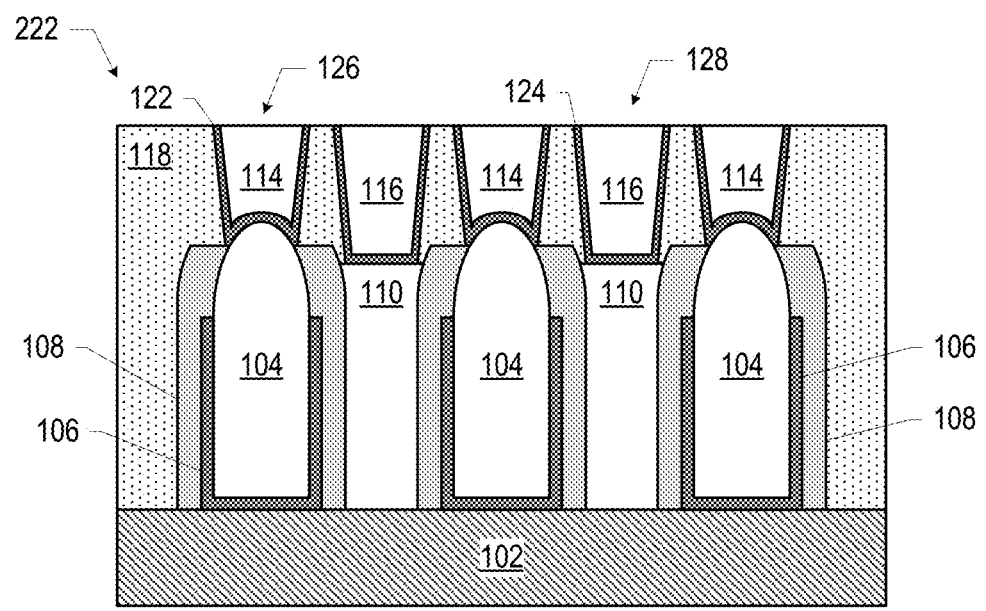

FIG. 2K illustrates an assembly 222 subsequent to forming, in the assembly 220 (FIG. 2J), vias 128 (including a liner material 124 and a metal fill 116) in electrical contact with the second metal 110. The vias 128 may be formed using the operations discussed above with reference to formation of the vias 126 in FIGS. 2H-2J. The resulting assembly 222 may take the form of the IC structure 100 of FIG. 1.

Figure 3:
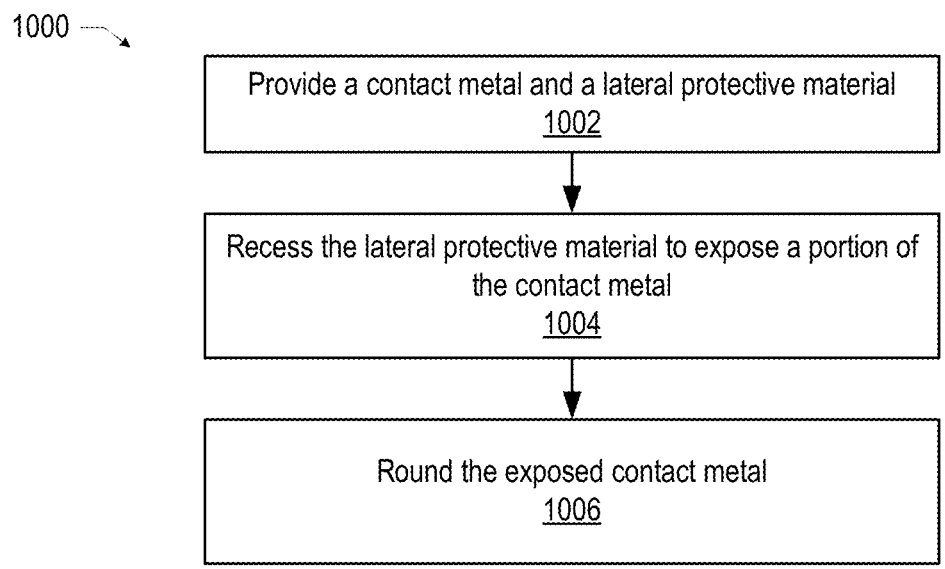
FIG. 3 is a flow diagram of a method of manufacturing an IC structure with contoured interconnects, in accordance with various embodiments.

FIG. 3 is a flow diagram of a method 1000 of manufacturing an IC structure with contoured contacts, in accordance with various embodiments. Although the operations of the method 1000 may be illustrated with reference to particular embodiments of the IC structures 100 disclosed herein, the method 1000 may be used to form any suitable contoured contacts. Operations are illustrated once each and in a particular order in FIG. 3, but the operations may be reordered and/or repeated as desired (e.g., with different operations performed in parallel when manufacturing multiple electronic components simultaneously).

At 1002, a contact metal and a lateral protective material may be provided. For example, the first metal 104 and the spacer material 108 may be provided as discussed above with reference to FIGS. 1 and 2A.

At 1004, the lateral protective material may be recessed to expose a portion of the contact metal. For example, the spacer material 108 may be recessed, as discussed above with reference to FIG. 2B, to expose a top surface of the first metal 104.

At 1006, the exposed contact metal may be rounded. For example, the first metal 104 may be rounded, as discussed above with reference to FIG. 2C.

The IC structures 100 and/or interconnects 150/160 disclosed herein may be included in any suitable electronic component. FIGS. 4-8 illustrate various examples of apparatuses that may include any of the IC structures 100 and/or interconnects 150/160 disclosed herein, or may be included in an IC package that also includes any of the IC structures 100 and/or interconnects 150/160 disclosed herein.

Figure 4:
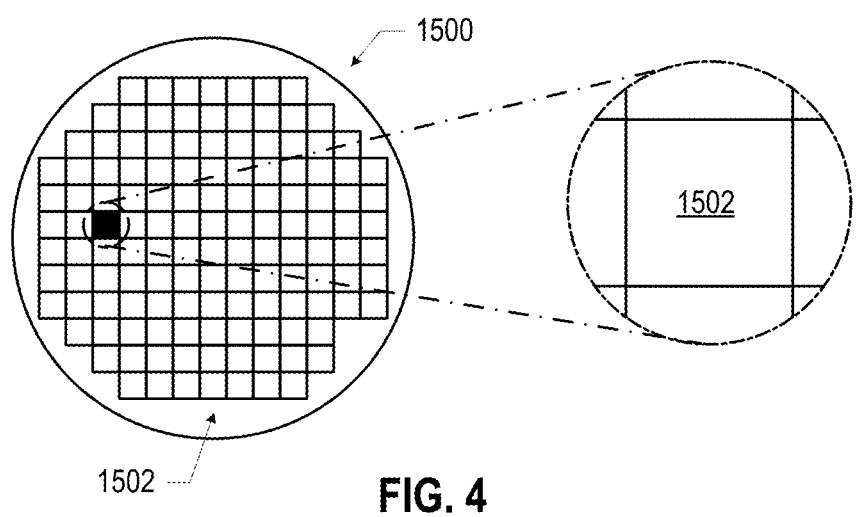
FIG. 4 is a top view of a wafer and dies that may include an IC structure with contoured contacts, in accordance with any of the embodiments disclosed herein.

FIG. 4 is a top view of a wafer 1500 and dies 1502 that may include one or more IC structures 100 and/or interconnects 150/160, or may be included in an IC package including one or more IC structures 100 and/or interconnects 150/160 (e.g., as discussed below with reference to FIG. 6) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 and/or interconnects 150/160 (e.g., as discussed below with reference to FIG. 5), one or more transistors (e.g., some of the transistors 1640 of FIG. 5, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 8) or other logic that is configured to store information in the memory devices or execute instructions stored in the memory array.

Figure 5:
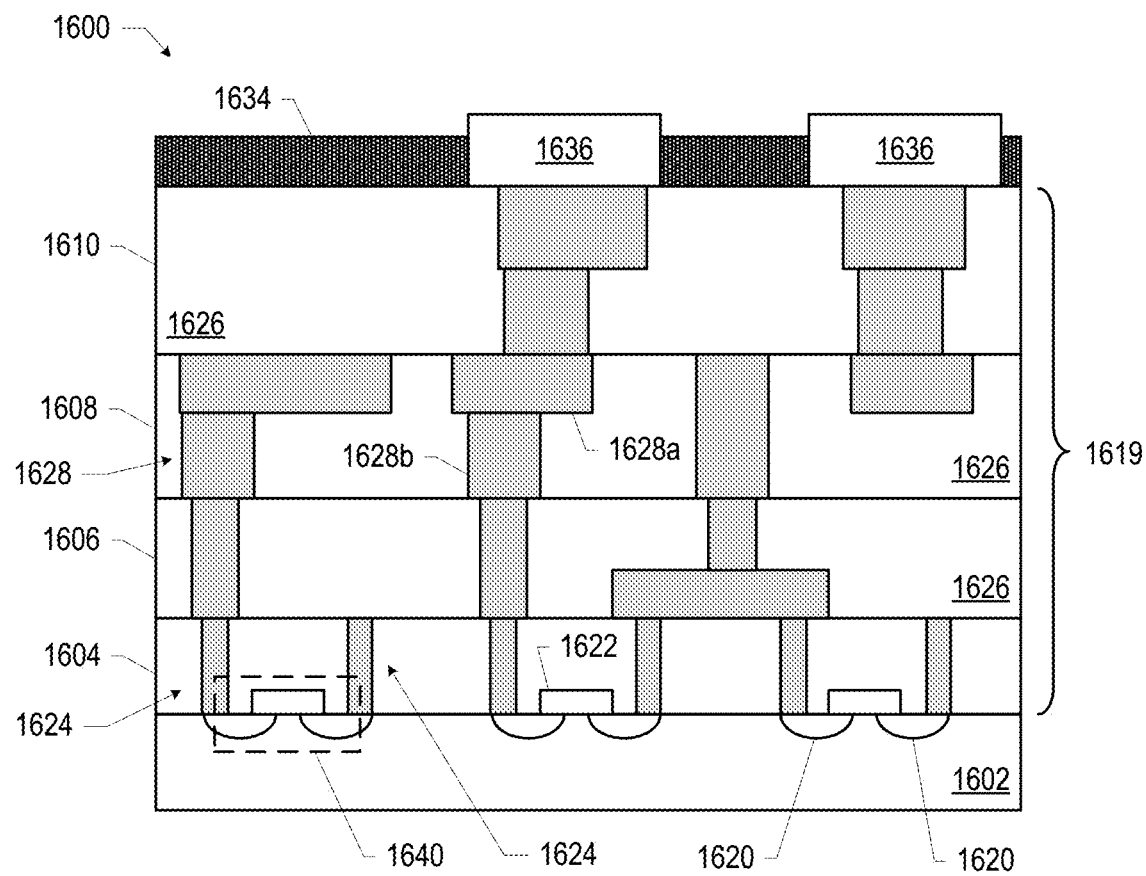
FIG. 5 is a side, cross-sectional view of an IC device that may include an IC structure with contoured interconnects, in accordance with any of the embodiments disclosed herein.

FIG. 5 is a side, cross-sectional view of an IC device 1600 that may include one or more IC structures 100 and/or interconnects 150/160, or may be included in an IC package including one or more IC structures 100 and/or interconnects 150/160 (e.g., as discussed below with reference to FIG. 6), in accordance with any of the embodiments disclosed herein. One or more of the IC devices 1600 may be included in one or more dies 1502 (FIG. 4). The IC device 1600 may be formed on a substrate 1602 (e.g., the wafer 1500 of FIG. 4) and may be included in a die (e.g., the die 1502 of FIG. 4). The substrate 1602 may be a semiconductor substrate composed of semiconductor material systems including, for example, n-type or p-type materials systems (or a combination of both). In some embodiments, the substrate 1602 may include silicon, germanium, indium antimonide, lead telluride, indium arsenide, indium phosphide, gallium arsenide, or gallium antimonide. The substrate 1602 may include, for example, a crystalline substrate formed using a bulk silicon or a silicon-on-insulator (SOI) substructure. Although a few examples of materials from which the substrate 1602 may be formed are described here, any material that may serve as a foundation for an IC device 1600 may be used. The substrate 1602 may be part of a singulated die (e.g., the dies 1502 of FIG. 4) or a wafer (e.g., the wafer 1500 of FIG. 4).

The IC device 1600 may include one or more device regions 1604 disposed on the substrate 1602. The device region 1604 may include features of one or more transistors 1640 (e.g., metal oxide semiconductor field-effect transistors (MOSFETs)) formed on the substrate 1602. In particular, the device region 1604 may include any of the IC structures 100 and/or interconnects 150/160 disclosed herein. The device region 1604 may include, for example, one or more S/D regions 1620, a gate 1622 to control current flow in the transistors 1640 between the S/D regions 1620, and one or more S/D contacts 1624 to route electrical signals to/from the S/D regions 1620. As noted above, the gate 1622 may be in electrical contact with any of the interconnects 150/160 disclosed herein, and the S/D contacts 1624 may include any of the interconnects 150/160 disclosed herein, as appropriate. The transistors 1640 may include additional features not depicted in FIG. 5 for the sake of clarity, such as device isolation regions, spacer material 108, further contacts, and the like. The transistors 1640 are not limited to the type and configuration depicted in FIG. 5 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors (e.g., when the base structure 102 includes a fin), and wrap-around or all-around gate transistors, such as nanoribbon and nanowire transistors (e.g., when the base structure 102 includes a nanoribbon or a nanowire).

Each transistor 1640 may include a gate 1622 including at least two materials: a gate dielectric and a gate metal. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate metal may include at least one p-type work function metal or n-type work function metal, depending on whether the associated transistor 1640 of the IC device 1600 is to be a p-type metal oxide semiconductor (PMOS) or an n-type metal oxide semiconductor (NMOS) transistor. In some implementations, the gate metal may include a stack of two or more metal layers, where one or more metal layers are work function metal layers and at least one metal layer is a fill metal layer. Further metal layers may be included for other purposes, such as a barrier layer. For a PMOS transistor, metals that may be used for the gate metal include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate metal include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the second metal 110 may consist of a U-shaped structure that includes a bottom portion substantially parallel to the surface of the substrate and two sidewall portions that are substantially perpendicular to the top surface of the substrate. In other embodiments, at least one of the metal layers that form the second metal 110 may simply be a planar layer that is substantially parallel to the top surface of the substrate and does not include sidewall portions substantially perpendicular to the top surface of the substrate. In other embodiments, the second metal 110 may consist of a combination of U-shaped structures and planar, non-U-shaped structures. For example, the second metal 110 may consist of one or more U-shaped metal layers formed atop one or more planar, non-U-shaped layers.

The S/D regions 1620 may be formed proximate to the semiconductor channel and adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device region 1604 through one or more interconnect layers disposed on the device region 1604 (illustrated in FIG. 5 as interconnect layers 1606-1610). For example, electrically conductive features of the device region 1604 (e.g., the gate 1622 and the S/D contacts 1624) may be electrically coupled with the interconnect structures 1628 of the interconnect layers 1606-1610. The one or more interconnect layers 1606-1610 may form a metallization stack 1619 of the IC device 1600. In some embodiments, one or more IC structures 100 and/or interconnects 150/160 (not shown) may be disposed in one or more of the interconnect layers 1606-1610, in accordance with any of the techniques disclosed herein. A interconnect 150/160 included in the metallization stack 1619 may be referred to as a "back-end" structure. In some embodiments, the IC device 1600 may not include any back-end IC structures 100 and/or interconnects 150/160; in some embodiments, the IC device 1600 may include both front- and back-end IC structures 100 and/or interconnects 150/160. One or more IC structures 100 and/or interconnects 150/160 in the metallization stack 1619 may be coupled to any suitable ones of the devices in the device region 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 5). Although a particular number of interconnect layers 1606-1610 is depicted in FIG. 5, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device region 1604 is formed. For example, the lines 1628a may route electrical signals in a direction in and out of the page from the perspective of FIG. 5. The vias 1628b may be arranged to route electrical signals in a direction of a plane that is substantially perpendicular to the surface of the substrate 1602 upon which the device region 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 5. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device region 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device region 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device region 1604) may be thicker.

The IC device 1600 may include a solder resist material 1634 (e.g., polyimide or similar material) and one or more conductive contacts 1636 formed on the interconnect layers 1606-1610. In FIG. 5, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 6:
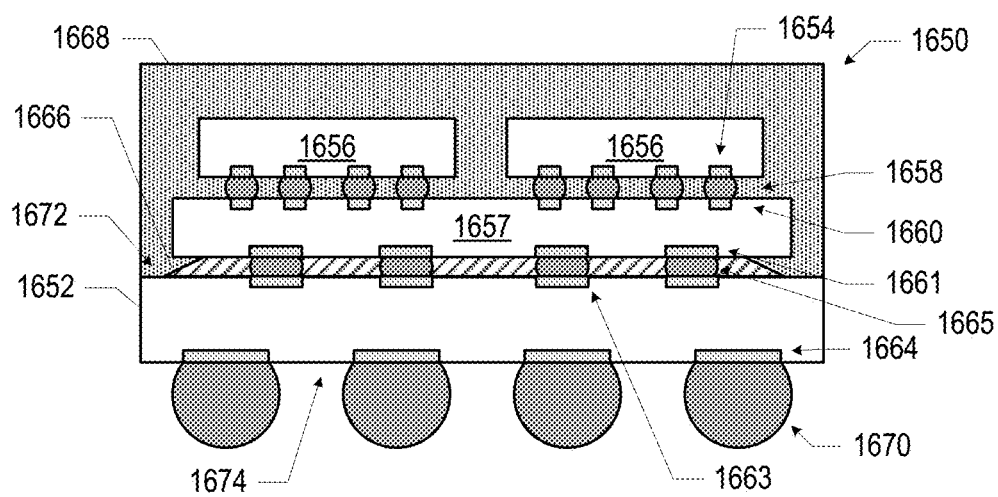
FIG. 6 is a side, cross-sectional view of an IC package that may include an IC structure with contoured interconnects, in accordance with various embodiments.

FIG. 6 is a side, cross-sectional view of an example IC package 1650 that may include one or more IC structures 100 and/or interconnects 150/160. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 5.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 6 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 6 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 6 are solder balls (e.g., for a ball grid array arrangement), but any suitable second-level interconnects 16770 may be used (e.g., pins in a pin grid array arrangement or lands in a land grid arrangement). The second-level interconnects 1670 may be used to couple the IC package 1650 to another component, such as a circuit board (e.g., a motherboard), an interposer, or another IC package, as known in the art and as discussed below with reference to FIG. 7.

The dies 1656 may take the form of any of the embodiments of the die 1502 discussed herein (e.g., may include any of the embodiments of the IC device 1600). For example, one or more of the dies 1656 may include IC structures 100 and/or interconnects 150/160, in accordance with any of the embodiments disclosed herein. In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 6 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 6, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 7:
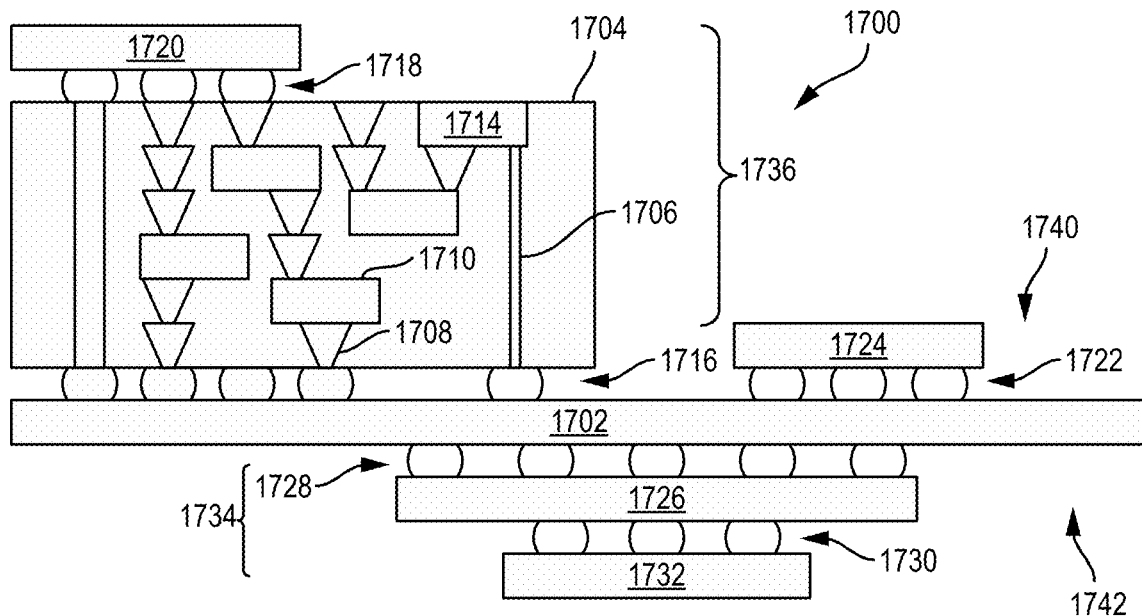
FIG. 7 is a side, cross-sectional view of an IC device assembly that may include an IC structure with contoured interconnects, in accordance with any of the embodiments disclosed herein.

FIG. 7 is a side, cross-sectional view of an IC device assembly 1700 that may include one or more IC packages or other electronic components (e.g., a die) including one or more IC structures 100 and/or interconnects 150/160, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 6 (e.g., may include one or more IC structures 100 and/or interconnects 150/160 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 7 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 7), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 7, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device (e.g., the IC device 1600 of FIG. 5), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 7, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 7 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 8:
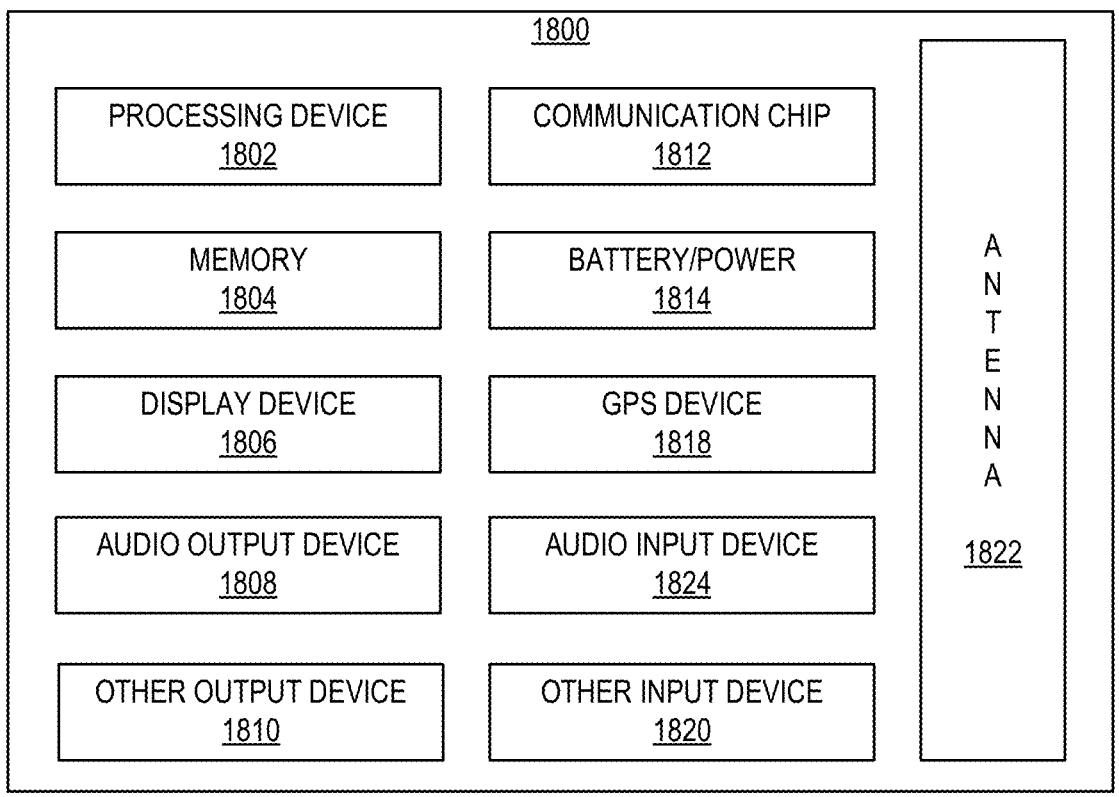
FIG. 8 is a block diagram of an example electrical device that may include an IC structure with contoured interconnects, in accordance with any of the embodiments disclosed herein.

FIG. 8 is a block diagram of an example electrical device 1800 that may include one or more IC structures 100 and/or interconnects 150/160, in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 8 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 8, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802.

This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a first contact; a second contact; and a third contact, wherein the third contact is between the first contact and the second contact, the first contact and the second contact have rounded top surfaces and the second contact is a gate contact or a source/drain (S/D) contact.

Example 2 includes the subject matter of Example 1, and further specifies that the first contact includes a first metal and a first liner material, and the first liner material is recessed below the rounded top surface of the first contact.

Example 3 includes the subject matter of Example 2, and further specifies that a height of the first contact has a first value, a distance between the rounded top surface of the first contact and the first liner material has a second value, and the second value is between 10% of the first value and 30% of the first value.

Example 4 includes the subject matter of any of Examples 2-3, and further specifies that the first liner material includes titanium and nitrogen.

Example 5 includes the subject matter of any of Examples 2-4, and further specifies that the first metal includes cobalt.

Example 6 includes the subject matter of any of Examples 2-5, and further specifies that a height of the first contact has a first value, a width of the first metal has a second value, and the second value is between 20% of the first value and 30% of the first value.

Example 7 includes the subject matter of any of Examples 2-6, and further specifies that the second contact includes a second metal and a second liner material, and the second liner material is recessed below the rounded top surface of the second contact.

Example 8 includes the subject matter of Example 7, and further specifies that a height of the second contact has a third value, a distance between the rounded top surface of the second contact and the second liner material has a fourth value, and the fourth value is between 10% of the third value and 30% of the third value.

Example 9 includes the subject matter of any of Examples 7-8, and further specifies that the second liner material includes titanium and nitrogen.

Example 10 includes the subject matter of any of Examples 7-9, and further specifies that the second metal includes cobalt.

Example 11 includes the subject matter of any of Examples 7-10, and further specifies that a height of the second contact has a third value, a width of the second metal has a fourth value, and the fourth value is between 20% of the third value and 30% of the third value.

Example 12 includes the subject matter of any of Examples 1-11, and further specifies that a height of the first contact has a first value, a width of the third contact has a second value, and the second value is between 20% of the first value and 30% of the first value.

Example 13 includes the subject matter of any of Examples 1-12, and further includes: first spacer material between the first contact and the third contact; and second spacer material between the second contact and the third contact.

Example 14 includes the subject matter of Example 13, and further specifies that the first contact includes a first metal, a width of the first metal has a first value, and a thickness of the first spacer material is between 10% of the first value and 30% of the first value.

Example 15 includes the subject matter of any of Examples 13-14, and further specifies that the first spacer material extends at least partially onto the rounded top surface of the first contact.

Example 16 includes the subject matter of any of Examples 13-15, and further specifies that the second spacer material extends at least partially onto the rounded top surface of the second contact.

Example 17 includes the subject matter of any of Examples 13-16, and further specifies that the first spacer material and the second spacer material include silicon, oxygen, nitrogen, and carbon.

Example 18 includes the subject matter of any of Examples 1-16, and further includes: a first via in conductive contact with the first contact; a second via in conductive contact with the second contact; and a third via in conductive contact with the third contact.

Example 19 includes the subject matter of Example 17, and further specifies that the first via includes a liner material and a fill metal, and the liner material is in contact with first metal of the first contact.

Example 20 includes the subject matter of any of Examples 18-19, and further specifies that the liner material is in contact with spacer material, and the spacer material is at least partially between the first contact and the third contact.

Example 21 includes the subject matter of any of Examples 1-20, and further includes: a base structure, proximate to base structure-facing surfaces of the first contact, the second contact, and the third contact.

Example 22 includes the subject matter of Example 21, and further specifies that the first contact has a base structure-facing surface between the base structure and the rounded top surface of the first contact, the second contact has a base structure-facing surface between the base structure and the rounded top surface of the second contact, and a distance between the first contact and the second contact proximate to the rounded top surfaces of the first and second contacts is greater than a distance between the first contact and the second contact proximate to the base structure-facing surfaces of the first and second contacts.

Example 23 includes the subject matter of any of Examples 21-22, and further specifies that the base structure includes a semiconductor fin.

Example 24 includes the subject matter of any of Examples 21-22, and further specifies that the base structure includes a semiconductor nanowire.

Example 25 includes the subject matter of any of Examples 1-24, and further specifies that the third contact includes a liner material and a metal.

Example 26 is an integrated circuit (IC) package, including: a package substrate; and an IC die coupled to the package substrate including: a first interconnect, a second interconnect, a third interconnect, wherein the third interconnect is between the first interconnect and the second interconnect, and the first interconnect and the second interconnect have top surfaces, and a base structure, wherein the first interconnect has a base structure-facing surface between the base structure and the top surface of the first interconnect, the second interconnect has a base structure-facing surface between the base structure and the top surface of the second interconnect, and a distance between the first interconnect and the second interconnect, proximate to the top surfaces of the first and second interconnects, is greater than a distance between the first interconnect and the second interconnect proximate to the base structure-facing surfaces of the first and second interconnects.

Example 27 includes the subject matter of Example 26, and further specifies that the first interconnect includes a first metal and a first liner material, and the first liner material is recessed below from the top surface of the first interconnect.

Example 28 includes the subject matter of Example 27, and further specifies that a height of the first interconnect has a first value, a distance between the top surface of the first interconnect and the first liner material has a second value, and the second value is between 10% of the first value and 30% of the first value.

Example 29 includes the subject matter of any of Examples 27-28, and further specifies that the first liner material includes titanium and nitrogen.

Example 30 includes the subject matter of any of Examples 27-29, and further specifies that the first metal includes cobalt.

Example 31 includes the subject matter of any of Examples 27-30, and further specifies that a height of the first interconnect has a first value, a width of the first metal has a second value, and the second value is between 20% of the first value and 30% of the first value.

Example 32 includes the subject matter of any of Examples 27-31, and further specifies that the second interconnect includes a second metal and a second liner material, and the second liner material is recessed below the top surface of the second interconnect.

Example 33 includes the subject matter of Example 32, and further specifies that a height of the second interconnect has a third value, a distance between the top surface of the second interconnect and the second liner material has a fourth value, and the fourth value is between 10% of the third value and 30% of the third value.

Example 34 includes the subject matter of any of Examples 32-33, and further specifies that the second liner material includes titanium and nitrogen.

Example 35 includes the subject matter of any of Examples 32-34, and further specifies that the second metal includes cobalt.

Example 36 includes the subject matter of any of Examples 32-35, and further specifies that a height of the second interconnect has a third value, a width of the first metal has a fourth value, and the fourth value is between 20% of the third value and 30% of the third value.

Example 37 includes the subject matter of any of Examples 26-36, and further specifies that a height of the first interconnect has a first value, a width of the third interconnect has a second value, and the second value is between 20% of the first value and 30% of the first value.

Example 38 includes the subject matter of any of Examples 26-37, and further includes: first spacer material between the first interconnect and the third interconnect; and second spacer material between the second interconnect and the third interconnect.

Example 39 includes the subject matter of Example 38, and further specifies that the first interconnect includes a first metal, a width of the first metal has a first value, and a thickness of the first spacer material is between 10% of the first value and 30% of the first value.

Example 40 includes the subject matter of any of Examples 38-39, and further specifies that the first spacer material extends at least partially onto the top surface of the first interconnect.

Example 41 includes the subject matter of any of Examples 38-40, and further specifies that the second spacer material extends at least partially onto the top surface of the second interconnect.

Example 42 includes the subject matter of any of Examples 26-41, and further specifies that the IC die further includes: a first via in conductive contact with the first interconnect, a second via in conductive contact with the second interconnect, and a third via in conductive contact with the third interconnect.

Example 43 includes the subject matter of Example 42, and further specifies that the first via includes a liner material and a fill metal.

Example 44 includes the subject matter of Example 43, and further specifies that the liner material is in contact with metal of the first interconnect.

Example 45 includes the subject matter of any of Examples 43-44, and further specifies that the liner material is in contact with spacer material, and the spacer material is at least partially between the first interconnect and the third interconnect.

Example 46 includes the subject matter of any of Examples 26-45, and further specifies that the base structure includes a semiconductor fin.

Example 47 includes the subject matter of any of Examples 26-45, and further specifies that the base structure includes a semiconductor nanowire.

Example 48 includes the subject matter of any of Examples 26-47, and further specifies that the base structure includes at least a portion of a metallization stack.

Example 49 includes the subject matter of Example 48, and further specifies that the first and second interconnects are source/drain (S/D) contacts.

Example 50 includes the subject matter of any of Examples 26-47, and further specifies that the first and second interconnects are gate contacts.

Example 51 includes the subject matter of Example 50, and further specifies that the third interconnect is a source/drain (S/D) contact.

Example 52 includes the subject matter of any of Examples 26-51, and further includes: conductive contacts at a surface of the die.

Example 53 includes the subject matter of any of Examples 26-52, and further includes: solder resist proximate to the conductive contacts.

Example 54 includes the subject matter of any of Examples 26-53, and further specifies that the package substrate includes an organic dielectric.

Example 55 is a computing device, including: a circuit board; and an integrated circuit (IC) die communicatively coupled to the circuit board, wherein the IC die includes interconnects that have rounded top surfaces.

Example 56 includes the subject matter of Example 55, and further specifies that a device region of the IC die includes the interconnects.

Example 57 includes the subject matter of any of Examples 55-56, and further specifies that the circuit board is a motherboard.

Example 58 includes the subject matter of any of Examples 55-57, and further specifies that the IC die is included in an IC package.

Example 59 includes the subject matter of any of Examples 55-58, and further includes: a display communicatively coupled to the circuit board.

Example 60 includes the subject matter of any of Examples 55-59, and further includes: wireless communication circuitry communicatively coupled to the circuit board.

Example 61 includes the subject matter of any of Examples 55-60, and further specifies that the computing device is a handheld computing device.

Example 62 includes the subject matter of any of Examples 55-60, and further specifies that the computing device is a server computing device.

Example 63 includes the subject matter of any of Examples 55-60, and further specifies that the computing device is a wearable computing device.

Example 64 includes the subject matter of any of Examples 55-63, and further specifies that the interconnects include source/drain (S/D) contacts.

Example 65 includes the subject matter of Example 64, and further specifies that a device region of the IC die further includes a gate contact between a pair of S/D contacts with rounded top surfaces.

Example 66 includes the subject matter of any of Examples 55-63, and further specifies that the interconnects include gate contacts.

Example 67 includes the subject matter of any of Examples 55-66, and further specifies that at least some of the interconnects are included in a metallization stack of the IC die.

The invention claimed is:

1. An integrated circuit (IC) structure, comprising:
a first interconnect comprising a first metal and a first liner material;
a second interconnect; and
a third interconnect, wherein the third interconnect is between the first interconnect and the second interconnect, the first interconnect and the second interconnect have rounded top surfaces, the second interconnect is a gate contact or a source/drain (S/D) contact, and the first liner material is recessed below the rounded top surface of the first interconnect.

2. The IC structure of claim 1, wherein a height of the first interconnect has a first value, a distance between the rounded top surface of the first interconnect and the first liner material has a second value, and the second value is between 10% of the first value and 30% of the first value.

3. The IC structure of claim 1, wherein a height of the first interconnect has a first value, a width of the first metal has a second value, and the second value is between 20% of the first value and 30% of the first value.

4. The IC structure of claim 1, wherein the second interconnect includes a second metal and a second liner material, and the second liner material is recessed below the rounded top surface of the second interconnect.

5. The IC structure of claim 4, wherein a height of the second interconnect has a third value, a distance between the rounded top surface of the second interconnect and the second liner material has a fourth value, and the fourth value is between 10% of the third value and 30% of the third value.

6. The IC structure of claim 1, wherein the first liner material comprises titanium and nitrogen.

7. The IC structure of claim 1, wherein the first metal comprises cobalt.

8. The IC structure of claim 1, wherein a height of the first interconnect has a first value, a width of the third interconnect has a second value, and the second value is between 20% of the first value and 30% of the first value.

9. The IC structure of claim 1, further comprising:
first spacer material between the first interconnect and the third interconnect; and
second spacer material between the second interconnect and the third interconnect.

10. The IC structure of claim 9, wherein a width of the first metal has a first value, and a thickness of the first spacer material is between 10% of the first value and 30% of the first value.

11. The IC structure of claim 9, wherein the first spacer material extends at least partially onto the rounded top surface of the first interconnect.

12. The IC structure of claim 11, wherein the second spacer material extends at least partially onto the rounded top surface of the second interconnect.

13. The IC structure of claim 9, wherein the first spacer material and the second spacer material comprises silicon, oxygen, nitrogen, and carbon.

14. The IC structure of claim 1, further comprising:
a first via in conductive contact with the first interconnect;
a second via in conductive contact with the second interconnect; and
a third via in conductive contact with the third interconnect.

15. The IC structure of claim 14, wherein the first via comprises a liner material and a fill metal, and the liner material is in contact with first metal of the first interconnect.

16. The IC structure of claim 15, wherein the liner material is in contact with spacer material, and the spacer material is at least partially between the first interconnect and the third interconnect.

17. The IC structure of claim 1, further comprising:
a base structure, proximate to base structure-facing surfaces of the first interconnect, the second interconnect, and the third interconnect.

18. The IC structure of claim 17, wherein the first interconnect has a base structure-facing surface between the base structure and the rounded top surface of the first interconnect, the second interconnect has a base structure-facing surface between the base structure and the rounded top surface of the second interconnect, and a distance between the first interconnect and the second interconnect proximate to the rounded top surfaces of the first and second interconnects is greater than a distance between the first interconnect and the second interconnect proximate to the base structure-facing surfaces of the first and second interconnects.

19. The IC structure of claim 1, wherein the third interconnect comprises a liner material and a metal.

* * * * *